United States Patent [19]

Schrenk

[11] Patent Number: 4,675,544

[45] Date of Patent: Jun. 23, 1987

[54] CMOS-INVERTER

[75] Inventor: Hartmut Schrenk, Haar, Fed. Rep. of Germany

[73] Assignee: Siemens Aktiengesellschaft, Berlin and Munich, Fed. Rep. of Germany

[21] Appl. No.: 908,311

[22] Filed: Sep. 17, 1986

Related U.S. Application Data

[63] Continuation of Ser. No. 653,537, Sep. 24, 1984.

[30] Foreign Application Priority Data

Oct. 28, 1983 [DE] Fed. Rep. of Germany ....... 3339253

[51] Int. Cl.$^4$ .................. H03K 17/10; H03K 3/027; H03K 17/687; G11C 11/40
[52] U.S. Cl. .................... 307/264; 307/451; 307/475; 307/279; 307/585; 307/270; 365/226; 365/203
[58] Field of Search ............. 307/450, 451, 475, 571, 307/576, 579, 585, 270, 264, 279, 290; 365/104, 226, 227, 228, 203

[56] References Cited

U.S. PATENT DOCUMENTS

| | | | |
|---|---|---|---|
| 4,216,390 | 8/1980 | Stewart ............................. | 307/264 |
| 4,469,959 | 9/1984 | Luke et al. ..................... | 307/475 X |
| 4,501,978 | 2/1985 | Gentile et al. .................. | 307/279 X |
| 4,506,164 | 3/1985 | Higuchi ......................... | 307/585 X |
| 4,508,983 | 4/1985 | Allgood et al. ................. | 307/452 X |
| 4,532,439 | 7/1985 | Koike .................................. | 307/450 |
| 4,555,642 | 11/1985 | Morales ......................... | 307/585 X |
| 4,563,595 | 1/1986 | Bose ............................. | 307/475 X |
| 4,568,842 | 2/1986 | Koike ............................. | 307/452 X |

Primary Examiner—Stanley D. Miller
Assistant Examiner—David R. Bertelson
Attorney, Agent, or Firm—Hill, Van Santen, Steadman & Simpson

[57] ABSTRACT

Reliable locking of a CMOS-inverter whose operating voltage lies in a high voltage range of approximately 20 V is provided when the circuit is activated with a CMOS-inverter of lower operating voltage. A normally-on n-channel MOS-FET whose control input is connected with the inverter output is connected in series with an MOS-FET of the CMOS-inverter.

8 Claims, 1 Drawing Figure

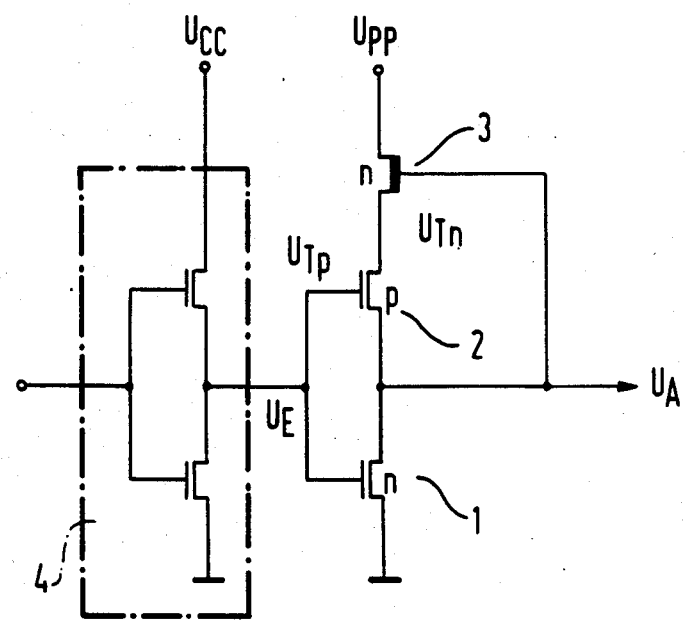

CMOS-INVERTER

This is a continuation of application Ser. No. 653,537, filed Sept. 24, 1984, now abandoned.

BACKGROUND OF THE INVENTION

The invention relates to a CMOS inverter comprised of a series connection of a normally off p-channel MOS-FET and a normally off n-channel MOS-FET whose common drain connection represents an output of the inverter.

There are instances of CMOS circuits in which different operating voltages are necessary. For example, in electrically erasable and programmable memories ($E^2$-PROMS) CMOS-inverters whose operating voltage lies in a so-called high-voltage range of around 20 V (for example, clearly above a so-called low voltage operating voltage of around 5 V), bust be activated by low voltage inverters. The p-channel MOS-FET of a high voltage inverter, however, on account of the maximum output voltage of the low voltage inverter being too low, can thus not be blocked so that a static forward current flows.

SUMMARY OF THE INVENTION

An object underlying the invention is to provide a CMOS-inverter of the above-captioned type which, even in the case of an input H-level in the low voltage range, gurrantees a reliable blocking of the p-channel MOS-FET.

This object is achieved in that there is connected in series with the p-channel MOS-FET an additional normally on n-channel MOS-FET whose control input is connected with the inverter output.

BRIEF DESCRIPTION OF THE DRAWINGS

The FIGURE shows a CMOS-high voltage inverter according to the present invention.

DESCRIPTION OF THE PREFERRED EMBODIMENTS

The FIGURE shows a CMOS-high voltage inverter which is comprised of a series connection of a normally off n-channel MOS-FET 1 and a normally off p-channel MOS-FET 2. The control inputs of these MOS-FETs jointly form the inverter input which is connected to a control voltage $U_E$. The common drain connection of the two MOS-FETs forms the inverter output with an output signal $U_A$. Connected in series with the p-channel MOS-FET 2 is a normally on n-channel MOS-FET 3 whose control input is connected with the inverter output. The drain connection of the additional n-channel MOS-FET 3 is connected with an operating voltage $U_{pp}$ which lies in a high voltage range of e.g. 20 V.

The input voltage $U_E$ is derived from a pre-connected low voltage CMOS-inverter 4 which, in the illustrated example, is comprised of a series connection of two normally off MOS-FETs and is operated with a low voltage operating voltatge $U_{cc}$ of about 5 V. The input signal $U_E$ can assume one of the two logic levels L or H respectively, whereby the H-level also lies in the low voltage range. The magnitude of the input voltage $U_E$, with which a value of the output signal $U_A$ of 0 volts is obtained, is determined by the difference of the starting voltage $U_{Tn}$ of the normally on n-channel MOS-FET 3 and the amount of the starting voltage $U_{Tp}$ of the p-channel MOS-FET 2.

For a statically low-current state of the above-described high voltage CMOS-inverter with an input voltage $U_E$ which corresponds approximately to the low voltage operating voltage $U_{CC}$, in the following advantageous dimensioning example is provided. The low voltage operating voltage lies at 5 V, the amount of the starting voltage $U_{Tn}$ of the normally on n-channel MOS-FET 3 typically lies at 3 V, and the amount of the starting voltage $U_{Tp}$ of the p-channel MOS-FET 2 typically lies between 0.5 V and 1 V. In order to switch the inverter with low dynamic forward current, the series connection of the p-channel MOS-Fet 2 and the normally on n-channel MOS-FET 3 must be dimensioned so as to be weakly conductive in relation to the n-channel MOS-FET 1. This is the case if, in the case of the normally on n-channel MOS-FET 3 and/or in the case of the normally off p-channel MOS-FET 2, the ratio of channel width and channel length is smaller than in the case of the normally off n-channel MOS-FET 1.

While various changes and modifications might be proposed by those skilled in the art, it will be understood that I wish to include within the claims of the patent warranted hereon all such changes and modifications as reasonably come within my contribution to the art.

I claim as my invention:

1. A CMOS-inverter system, comprising:
    a CMOS-inverter formed of a series connection of a normally off p-channel MOS-FET and a normally off N-channel MOS-FET having their drains connected in common and their gates connected in common, and a source of the normally off n-channel MOS-FET directly connecting to a reference potential;
    the common drain connection being an output of the inverter and the common gate connection being an input of the inverter;
    a normally on n-channel MOS-FET connected between a supply voltage and the p-channel MOS-FET, a control input of the normally on n-channel MOS-FET being connected to the output of the inverter; and
    the supply voltage having a value higher than a high logic level of an input signal connected to said inverter input.

2. A CMOS-inverter system comprising:
    A CMOS-inverter formed of a series connection of a normally off p-channel MOS-FET and a normally off n-channel MOS-FET having their drains connected in common and their gates connected in common;
    the common drain connection being an output of the inverter and the common gate connection being an input of the inverter;
    a normally on n-channel MOS-FET connected in series with the p-channel MOS-FET, a control input of the normally on n-channel MOS-FET being connected to the output of the inverter; and
    a first operating voltage lying in a high voltage range connecting to a drain of the normally on n-channel MOS-FET, and another CMOS inverter being provided connected to a relatively smaller second operating voltage, and whose output connects to an input of the CMOS-inverter.

3. A CMOS-inverter system according to claim 1 wherein the normally on n-channel MOS-FET is designed such that it is more weakly conductive relative to the normally off n-channel MOS-FET.

4. A system according to claim 3 wherein a ratio of channel width to channel length of the normally on n-channel MOS-FET is smaller than a ratio of channel width to channel length of the normally off n-channel MOS-FET.

5. A CMOS-inverter system according to claim 1 wherein the p-channel MOS-FET and series connected normally on n-channel MOS-FET are designed so as to be weakly conductive in relation to the normally off n-channel MOS-FET.

6. A system according to claim 5 wherein a ratio of channel width to channel length of the normally on n-channel MOS-FET and normally off p-channel MOS-FET is smaller than a ratio of channel width to channel length of the normally off n-channel MOS-FET.

7. A CMOS-inverter according to claim 1 wherein the normally off p-channel MOS-FET is dimensioned to be more weakly conductive than the normally off n-channel MOS-FET.

8. A CMOS-inverter system, comprising:
a first high voltage CMOS-inverter formed of a series connection of a normally off n-channel MOS-FET and a normally off p-channel MOS-FET having their drains connected in common so as to form an output of the high voltage inverter and their gates being connected in common so as to form an input of the high voltage inverter;
a normally on n-channel MOS-FET having its drain connected to a relatively high operating voltage, its source connected to a source of the normally off p-channel MOS-FET, and its gate connected to the high voltage inverter output; and
a low voltage CMOS-inverter formed of first and second transistors connected to a low operating voltage lower than said high operating voltage, an output of the low-voltage inverter being connected to the input of the high-voltage inverter.

* * * * *